United States Patent
Nicholson et al.

(10) Patent No.: US 6,493,231 B2
(45) Date of Patent: *Dec. 10, 2002

(54) ELECTRICAL APPARATUS

(75) Inventors: Brian Frederick Nicholson, Chelmsford (GB); David Michael Jacobson, Wembley (GB); Surinder Pal Singh Sangha, Heston (GB); Giles Humpston, Aylesbury (GB); James Hugh Vincent, Milton Keynes (GB); William Martin Lovell, Fareham (GB)

(73) Assignee: BAE Systems Electronics Limited (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/308,684

(22) PCT Filed: Nov. 20, 1997

(86) PCT No.: PCT/GB97/03194

§ 371 (c)(1), (2), (4) Date: Jul. 29, 1999

(87) PCT Pub. No.: WO98/24281

PCT Pub. Date: Jun. 4, 1998

(65) Prior Publication Data

US 2002/0054482 A1 May 9, 2002

(30) Foreign Application Priority Data

Nov. 23, 1996 (GB) .............................................. 9624398

(51) Int. Cl.[7] .................................................. H05K 9/00

(52) U.S. Cl. ........................ 361/752; 361/753; 361/816; 361/799; 174/35 R; 403/231

(58) Field of Search ................................ 361/752, 753, 361/801, 799, 807, 816, 818, 800; 174/35 R, 50, 50.5, 51, 52.1, 52.4; 312/265.1–265.6; 403/231

(56) References Cited

U.S. PATENT DOCUMENTS

| | | | |
|---|---|---|---|
| 5,057,648 A | * 10/1991 | Blough et al. ............. 174/52.2 |
| 5,106,009 A | 4/1992 | Humpston et al. |
| 5,109,594 A | 5/1992 | Sharp et al. |
| 5,126,511 A | * 6/1992 | Beauregard et al. ....... 174/52.4 |
| 5,160,903 A | 11/1992 | Torkington et al. |
| 5,175,611 A | 12/1992 | Richardson et al. |
| 5,303,320 A | * 4/1994 | Duffie ......................... 385/134 |
| 5,365,108 A | * 11/1994 | Anderson et al. ........... 257/678 |
| 5,397,854 A | * 3/1995 | Catt et al. .................. 174/35 R |
| 5,433,260 A | * 7/1995 | Taylor .......................... 164/97 |
| 5,831,211 A | * 11/1998 | Gartung et al. ............... 174/48 |

FOREIGN PATENT DOCUMENTS

| EP | 0 416 847 A2 | 3/1991 |
|---|---|---|
| GB | 2 132 413 A | 7/1984 |
| WO | WO 84/02612 | 7/1984 |
| WO | WO 97/03775 | 2/1997 |

* cited by examiner

Primary Examiner—Jayprakash N. Gandhi
(74) Attorney, Agent, or Firm—Kirschstein, et al.

(57) ABSTRACT

A housing for a microwave circuit is formed from a base made of metal matrix composite material and walls made of sheet metal. The base and the walls are joined together by diffusion soldering. Some holes to receive feedthroughs are formed at the junction of the base and a wall.

12 Claims, 1 Drawing Sheet

ELECTRICAL APPARATUS

BACKGROUND OF THE INVENTION

This invention relates to electrical apparatus and is particularly, but not exclusively, related to housings for microwave circuits. The term microwave includes circuits operating at or above a frequency of 1 GHz and may cover millimetric, quasi-optical and optical frequencies.

It is convenient to house an electrical circuit in a housing. As well as providing protection against environmental and other influences the housing can provide an electrical function. Electrically conducting metal boxes are used as housings and serve to screen against leakage of electrical signals. This is particularly important for a circuit operating at microwave frequencies where electrical signals are prone to leak from the circuit. A conductive housing may also provide a conductive ground plane or a conductive path. In addition it is convenient for a housing to be thermally conductive in order to remove heat from the circuit.

Conductive housings are conventionally formed out of sheet metal, such as aluminium, brass or stainless steel, or machined out of solid metal. Aluminium is preferred because of its ease of machining, low cost and low weight.

Circuits are often fabricated on thin substrates of ceramic type materials including aluminium oxide, boron nitride and sapphire or on semiconductor materials such as silicon, gallium arsenide, CdHgTe or InP. It is important that the substrate is in intimate contact with a thermally conductive mounting surface (which is usually flat) in order to remove heat efficiently from the substrate and thus from the circuit. It is also important that good electrical contact is achieved between the substrate and the mounting surface. Usually the face of the substrate in contact with the mounting surface is provided with a conductive layer and bonded with a conductive adhesive. The substrates generally have a low coefficient of thermal expansion (CTE) and metal housings in which they are housed have a relatively high CTE. Therefore direct mounting of such a substrate directly onto part of a metal housing is not advisable since over the temperature range of operation, differential thermal expansion may damage the substrate. This is particularly the case for a microwave circuit because it may be relatively large, for example in the region of 10 cm long.

Materials which can be used as mounting surfaces are available which have a low CTE over a limited range of temperatures. These materials are usually metal alloys. An example is a commercially available material called Kovar (Fe-29Ni-17Co wt%). Although these materials are satisfactory for small circuits, they are less so for larger circuits since generally they are expensive. Furthermore, they have high densities, relatively poor thermal conductivity and they do not machine readily.

Another type of material having a low CTE is a metal matrix composite (MMC) material. This comprises a metal matrix or binder having in it a filler of a material different to the matrix, often in the form of crystals in the microstructure of the alloy material. MMC material is relatively lightweight, has high thermal conductivity and low CTE. Furthermore it is relatively stiff. This is advantageous because it resists flexing under vibration and thus protects the circuit from damage. However MMC materials are generally difficult to machine.

Difficulty in machining such low CTE materials increases as the size of the housings increase. Simple single compartment small housings are easier to make than large housings having multiple, relatively deep, compartments.

SUMMARY OF THE INVENTION

It is an object of the present invention to provide an improved housing for electrical circuits.

According to a first aspect the present invention provides a housing for an electrical circuit comprising a plurality of parts joined together by diffusion soldering in which at least one hole passing from the inside of a compartment in the housing to the outside of the compartment is formed at the junction of at least two of the parts.

Preferably a housing comprises a plurality of compartments each of which is adapted to receive at least one circuit. The or each circuit may be sealed in a compartment by a lid. The or each hole may pass from the inside of the compartment to the inside of another compartment or from the inside of the compartment to the outside of the housing.

Using diffusion soldering is advantageous because it means that there can be a series of steps in assembling the housing. It permits assembly in a number of separate stages without previously made joints remelting. It is a relatively low temperature process which minimizes distortion of the base by heat or differential contraction following the joining operation. This is important because there must be good thermal and electrical contact as discussed above.

Preferably the housing is conductive. The housing may be coated with a high conductivity material such as silver. This is advantageous for high frequency applications. A coating may be applied to individual pieces before joining, or to a complete assembly.

Preferably one or more of the plurality of parts comprises MMC material. Preferably the MMC material comprises a matrix such as aluminium or aluminium/copper or aluminium/silicon. Preferably the metal matrix composite comprises a dispersion of crystals in the matrix. The dispersion may comprise silicon and/or silicon carbide. Preferably the ratio by volume of matrix material and dispersion material is 1:1. Most preferably there is more dispersion material than matrix material by volume.

Preferably the housing is fabricated by assembling together one or more walls and a base. Conveniently the walls may comprise an external outer wall divided by one or more internal walls into a plurality of compartments. The base may be of a low CTE material such as Kovar. Preferably it is of MMC material. Preferably the walls are of MMC material. Alternatively the walls may be of another material such as Kovar, aluminium, aluminium alloy, copper alloy including copper/tungsten or steel.

Preferably at least one wall and the base are of different materials. Any combination of materials may be used as long as they have appropriate electrical properties and their CTEs are not sufficiently different so as to lead to stresses caused by differential thermal expansion or contraction being larger than the strength of the joints over the temperature range of use. An advantage of making parts of the housing from different materials is that port of the housing which is to be of MMC material can be chosen to be in a shape which is relatively easy to machine or fabricate whilst more complex shapes, for example the walls, may be formed of material which may easily be pressed, punched, bent or otherwise formed into shape. As a result, parts of the housing not needing to be of low CTE may be made from cheaper materials. Furthermore, they may be fabricated to be thinner and lighter. One such embodiment may be an MMC material base and a peripheral wall formed from aluminium.

The circuit may be joined to the base by a suitable conductive adhesive or they may be diffusion soldered together. The circuit may be attached directly to the base or attached to an intermediate plate of MMC material or another low CTE material which is attached in turn to the base.

The term circuit includes a circuit mounted on a substrate. Preferably the substrate is in contact with the base.

Preferably the or each hole is adapted to receive a feedthrough.

A further advantage of joining initially separate walls to the base is that feedthroughs for conductors passing through the walls may be located very close to the base. The closeness of holes to a base in monolithic housings is determined by tool clearance inside a compartment and above the base. Conveniently, rather than holes being drilled, cut-outs or notches at an edge of a wall may be machined which form holes when the walls and base are joined.

According to a second aspect the present invention provides a housed circuit housed in a housing in accordance with the first aspect of the invention.

Preferably the electrical circuit is a microwave circuit.

BRIEF DESCRIPTION OF THE DRAWINGS

An embodiment of the invention will now be described, by way of example only, with reference to the accompanying drawings in which.

DETAILED DESCRIPTION OF THE PREFERRED EMBODIMENTS

Figure 1:
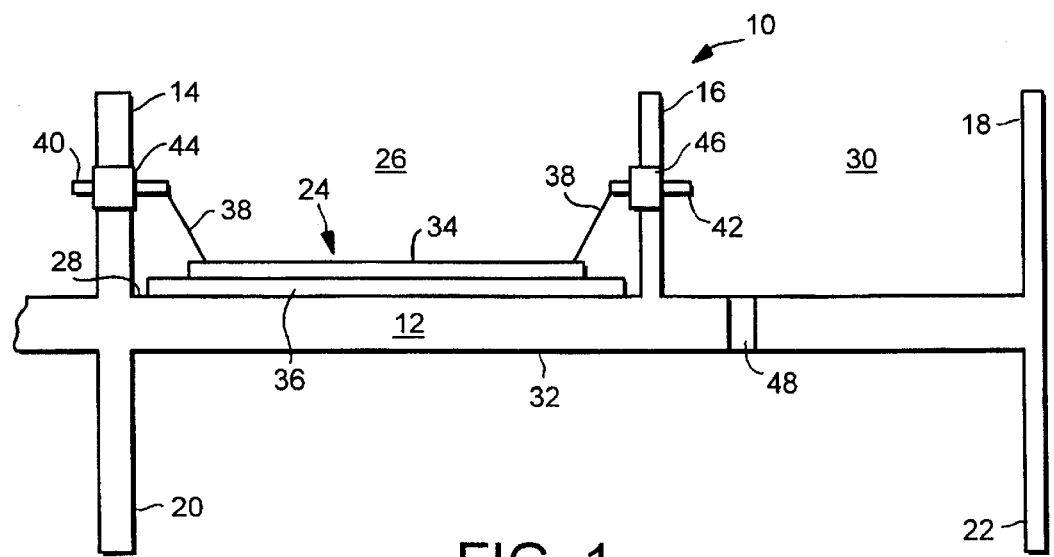
FIG. 1 shows a housing according to the prior art.

A housing 10 according to the prior art is shown in FIG. 1. The housing is a single piece of aluminium which has been machined from an aluminium block to form a base 12 and walls 14, 16, 18, 20 and 22. In the embodiment shown only one circuit 24 is present, which is mounted on a top face 28 of the base 12 in a compartment 26. Other circuits may be mounted in an adjacent compartment 30 or on a bottom face 32 of the base 12.

The circuit 24 comprises a circuit board 34 which is bonded to a plate of Kovar 36. In this embodiment the circuit board 34 is bonded to the plate 36 by a conductive epoxy resin. The circuit board 34 and the plate 36 have similar CTEs and differential thermal expansion over an operating temperature range is minimized. However there usually remains a mismatch in CTE between the plate 36 and the base 12. To allow for this the plate is attached to the base by means of screws passing through holes in the form of slots which are present in the plate 36. Therefore differential thermal expansion can be accommodated. However, as the plate 36 expands or contracts the earth path between the plate 36 and the base 12 changes which can affect the electrical operation and performance of the circuit 24.

Connections 38 from the circuit 34 are taken through the walls 14 and 16 by conductors 40 and 42. The conductors are held in the walls 14 and 16 by insulators 44 and 46. Since the housing 10 is formed from a single block of aluminium the heights of holes formed in the walls 14 and 16 to accommodate the conductors 40 and 42 and insulators 44 and 46 are determined by clearance for the tool needed to form the holes. Conductors which are raised above the ground plane (base 12) tend to radiate electromagnetic radiation and can cause coupling between circuits. This is undesirable. Connections may be made through holes 48 in the base 12.

Figure 2:
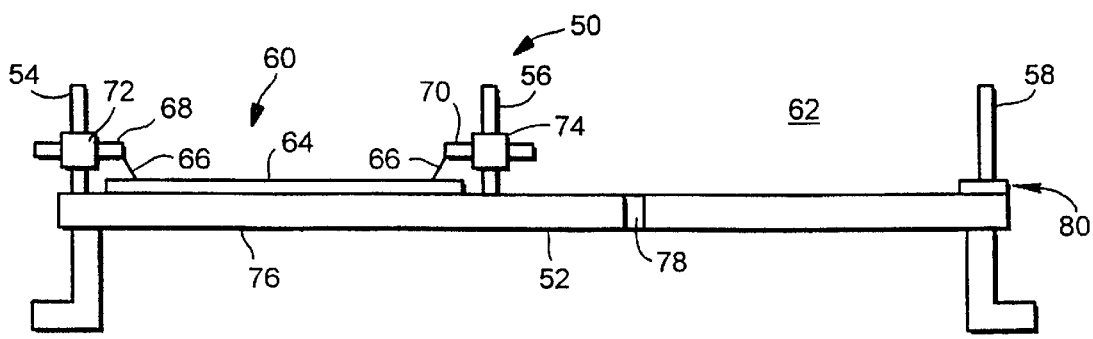
FIG. 2 shows a housing according to the present invention.

FIG. 2 shows a housing 50 according to the invention. The housing 50 has a base 52 comprising MMC material and walls 54, 56 and 58 defining compartments 60 and 62. The walls comprise an external frame comprising walls 54 and 58 and, in this embodiment, a single internal wall 56 which divides the housing into compartments.

A suitable MMC material to be used for the housing 50 is a silicon based alloy as described in International Application No. PCT/GB96/01730 in which silicon forms a substantially continuous phase of randomly orientated crystals in an alloy material. Another suitable MMC material comprises about 70% by volume SiC particulate bound in Al or Al alloy matrix. 70% represents the practical maximum SiC loading. Lower SiC content materials have higher, less favourable CTEs. Such MMC materials are made by producing a dense compact of SiC with a polymer binder. The binder is then burnt out leaving a SiC particulate and molten Al or Al alloy is forced in under pressure to fill the gaps resulting in a solid material of almost 100% density. Alternatively a pressureless infiltration process may be used in which molten Al is induced to wet the SiC particulate.

Compartment 60 is shown populated with a circuit board 64 which is attached to the base using a conductive epoxy resin. Connections 66 are taken through the walls 54 and 56 by conductors 68 and 70 which are held by insulators 72 and 74. In common with the prior art, other compartments may be populated with electronics as well as the under face 76 of the base 52. Connections may be made through holes 78 in the base 52.

In the embodiment described the walls 54, and 58 are made from a material which is different to that of the base 52. In this embodiment the walls are made from aluminium alloy although any material with suitable properties may be used. Internal walls, such as wall 56 are made of MMC material. Since this material has a CTE matched to that of the base 52 this wall, and particularly its bond to the base, will not suffer stresses due to differential thermal expansion, and so this may serve to reinforce walls 54 and 58 which may suffer such stresses.

The housing 50 is assembled before being populated with electronics by joining the walls 54, 56 and 58 to the base 52 by a diffusion soldering process. Such a process is disclosed in European Patent No. EP 0 416 847. A joint between the walls 54, 56 and 58 and the base 52 is initially formed with a low melting point metal such as tin. Prolonged heating at a moderate temperature causes the tin to diffuse into a high melting point metal such as silver to form alloys or intermetallic compounds having much higher melting points than that of tin. In this example a tin layer of 2–6 $\mu$m thickness is melted at about 250° C. whilst the joint is under a moderate pressure of approximately 10 kg/cm$^2$. The tin diffuses into the silver and forms Ag$_3$Sn in a time period of about 30 minutes. Further heating converts the joint into silver having tin in solid solution. An advantage of using diffusion soldering is that the housing 50 may be assembled in a number of steps without remelting of any joints formed previously.

An advantage of joining together walls and base 52 which were initially separate rather than forming them out of a single block of material is that holes required in walls and the base may be formed where needed before the housing is assembled. It is possible to form notches or cut-outs at an edge of a wall and join the wall to the base 52 so that a hole is formed. Thus there is more freedom in the shape of holes which can be formed and shapes other than circular may be readily obtained. Furthermore, holes can be formed at the level of the base 52. Such a construction permits the use of ceramic planar feedthroughs which reduce the height of the interconnections to little above that of the substrate. This is indicated schematically in FIG. 2 by numeral 80.

Although in this embodiment a feedthrough through an external wall 58 is shown in close proximity to the ground plane, the invention is especially useful in providing such feedthroughs for internal walls such as wall 56. Access for tooling inside compartments is more difficult than access for tooling to external walls to the housing 50.

The feedthroughs are incorporated into the assembly at the same time as the walls are joined to the base 52. Alternatively they may be incorporated in a subsequent soldering process. Not only does this enable a compact packaged component to be made but also radiation by conductors is much reduced due to their proximity to the ground plane.

In embodiments of housings which are to be used for high frequency applications the base 52 and walls 54, 56 and 58 are coated with a high conductivity material such as silver. Such a coating may be applied to the walls and base before assembly or after they are joined together.

Typically for microwave applications the housing has a relatively large plan area, for example in the order of 30 cm by 30 cm. This may be sub-divided into a number of compartments having plan areas in the order of 5 cm by 5 cm or 5 cm by 10 cm.

Once the housing is formed and populated with electronics, a lid is placed on to seal the compartments 60 and 62. The lid may seal the compartments environmentally, electrically or both.

What is claimed is:

1. A housing for screening against electrical signal leakage in an electrical circuit, comprising: a plurality of initially separate walls joined together to bound at least one compartment for accommodating the electrical circuit, one of the walls being a base on which the electrical circuit is mounted in surface area contact therewith, another of the walls being joined to the base at a junction; at least one hole passing through said another of the walls at the junction into the compartment, said at least one hole being positioned at the base; and a feedthrough mounted at the junction in and extending through said at least one hole, for making an electrical interconnection to the electrical circuit pass through the hole in close proximity to the electrical circuit to resist radiation of electromagnetic energy from the interconnection.

2. The housing according to claim 1, in which the walls are constituted of an electrically conductive material, and in which the base is a ground plane to which the electrical circuit is electrically grounded.

3. The housing according to claim 1, in which said another of the walls has a peripheral edge forming a notch, and in which the notch partly bounds said at least one hole at the junction.

4. The housing according to claim 1, in which the at least one hole passes from the inside of the compartment to an inside of another compartment.

5. The housing according to claim 1, in which the at least one hole passes from the inside of the compartment to an outside of the housing.

6. The housing according to claim 1, in which at least two of the plurality of walls are of different materials.

7. The housing according to claim 1, in which the plurality of walls is of the same material.

8. The housing according to claim 1, in which the base is of a metal matrix composite material.

9. The housing according to claim 1, in which there are more than two walls.

10. The housing according to claim 1, in which the electrical circuit is a microwave circuit.

11. The housing according to claim 1, wherein said another of the walls lies in a plane generally perpendicular to the base.

12. The housing according to claim 1, wherein the walls are diffusion soldered to each other.

* * * * *